United States Patent
Ferrero et al.

(10) Patent No.: US 7,567,080 B2
(45) Date of Patent: Jul. 28, 2009

(54) METHOD FOR DETERMINING AN INTEGRAL SUN PROTECTION FACTOR ENCOMPASSING UVA AND UVB RADIATION

(75) Inventors: Louis Ferrero, Nice (FR); Leonhard Zastrow, Monaco (MC); Karin Golz-Berner, Monaco (MC); Norbert Groth, Waldesruh (DE); Thomas Herrling, Berlin (DE)

(73) Assignees: Coty B.V., Haarlem (NL); Privatinstitut fuer Dermatologische Produktforschung Galenus GmbH, Berlin (DE)

( * ) Notice: Subject to any disclaimer, the term of this patent is extended or adjusted under 35 U.S.C. 154(b) by 0 days.

(21) Appl. No.: 11/568,148

(22) PCT Filed: Apr. 14, 2005

(86) PCT No.: PCT/EP2005/004148

§ 371 (c)(1),
(2), (4) Date: Dec. 14, 2007

(87) PCT Pub. No.: WO2005/103659

PCT Pub. Date: Nov. 3, 2005

(65) Prior Publication Data

US 2008/0224059 A1    Sep. 18, 2008

(30) Foreign Application Priority Data

Apr. 22, 2004    (DE) .................... 10 2004 020 644

(51) Int. Cl.
*G01V 3/00*    (2006.01)
(52) U.S. Cl. ...................... 324/309; 324/300
(58) Field of Classification Search ......... 324/300–322; 600/407–445
See application file for complete search history.

(56) References Cited

U.S. PATENT DOCUMENTS 5,705,146 A *   1/1998   Lindquist ..................... 424/59

(Continued)

FOREIGN PATENT DOCUMENTS

WO    99 66881    12/1999
WO    01 26617 A1    4/2001

OTHER PUBLICATIONS

T. Herrling et al.; "UV-induced free radicals in the skin detected by ESR spectroscopy and imagin using nitroxides"; Free Radical Biology and Medicine; vol. 35, 2003, pp. 59-67. Cited in International Search Report. Document not provided.

(Continued)

*Primary Examiner*—Brij B Shrivastav
(74) *Attorney, Agent, or Firm*—Bruce S. Londa; Norris McLaughlin & Marcus, PA

(57) ABSTRACT

The invention relates to a method for determining an integral sun protection factor (∫ SPF or iSPF) which encompasses both UVA and UVB radiation and can be used for classifying cosmetic and dermatological sunscreens. The method comprises the steps of applying a defined amount of the sunscreen onto a defined area of a skin substrate impregnated with a spin trap, exposing the skin substrate to a defined amount of UVA- and UVB rays by a sun simulator, subjecting the skin substrate exposed to radiation to an electron spin resonance (ESR) measurement, recording the number of free radicals trapped as a real number×$10^{12}$ free radicals/mg of skin sample, and determining the integral sun protection factor ∫ SPF according to the equations (1) and (2) and (8)

$$\int SPF = \frac{E_0}{E} \qquad (1)$$

Figure 1:
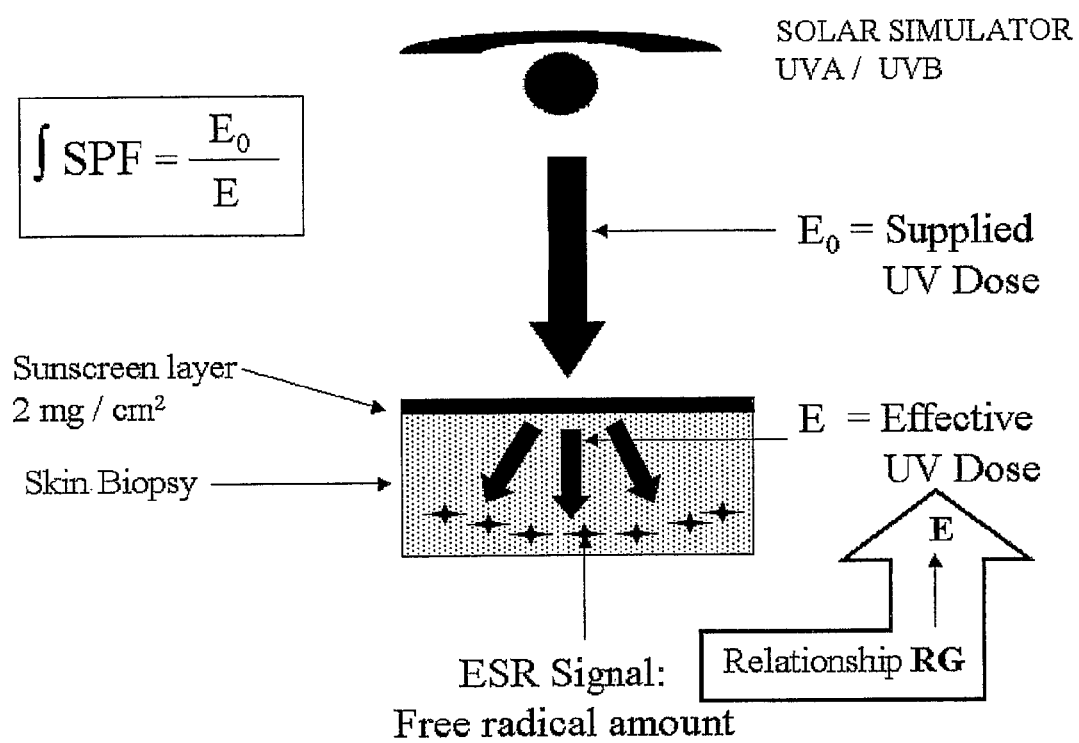

$$\log_{10}(E) = a \cdot \log_{10}(X \cdot 1000) + b \qquad (2)$$

$$E = 10^{\log 10(E)}. \qquad (8)$$

12 Claims, 3 Drawing Sheets

U.S. PATENT DOCUMENTS

| | | | | |
|---|---|---|---|---|
| 5,968,485 | A * | 10/1999 | Robinson | 424/59 |
| 2006/0133996 | A1* | 6/2006 | Haywood et al. | 424/9.1 |
| 2006/0234927 | A1* | 10/2006 | Youdim et al. | 514/12 |
| 2007/0140996 | A1* | 6/2007 | Damiani et al. | 424/59 |

OTHER PUBLICATIONS

Haywood Rachel et al.; "Sunscreens inadequately protect against ultraviolet-A-induced free radicals in skin: Implications for skin aging and melnom?"; Journal of Investigative Dermatology, New York, NY, US; vol. 121, No. 4, Oct. 2003, pp. 862-868. Cited in International Search Report. Document not provided.

Hitoshi Masaki et al.; "Detection of hydrogen peroxide and hydroxyl radicals in murine skin fibroblasts under UVB irradiation"; Biochemical and Biophysical Research Communications; vol. 206, No. 2, 1995, pp. 474-479. Cited in International Search Report. Document not provided.

Hitoshi Masaki et al; "Increased generation of hydrogen peroxide possibly from mitochondrial respiratory chain after UVB irradiation of murine fibroblasts"; Journal of Dermatological Science; vol. 14, 1977, pp. 207-216. Cited in International Search Report. Document not provided.

Francoise Bernerd et al.; "The sun protection factor (SPF) inadequately defines broad spectrum photoprotection: demonstration using skin reconstructed in vitro exposed to UVA, UVB or UV-solar simulated radiation"; European Journal of Dermatology; vol. 13, 2003, pp. 242-249. Cited in International Search Report. Document not provided.

* cited by examiner

METHOD FOR DETERMINING AN INTEGRAL SUN PROTECTION FACTOR ENCOMPASSING UVA AND UVB RADIATION

The present invention relates to a method for determining an integral sun protection factor (∫ SPF or iSPF) which encompasses both UVA and UVB radiation and can be used for classifying cosmetic and dermatological sunscreens.

It is known that UV radiation considerably increases the production of free radicals in the skin. Reactive oxygen species, such as the hydroxyl radical *OH⁻, the superoxide anion radical $O_2^-$ and singlet molecular oxygen $^1O_2$, are produced which, in their turn, cause lipid radicals L* to be formed. Therefore, cosmetic and dermatological sunscreen preparations contain UV filter substances and, in addition, small amounts of anti oxidants.

Further, it has been also confirmed by means of electron spin resonance (ESR) imaging that UVA and UVB rays penetrate into the skin up to different depths, as is known from the proceedings of the 22$^{nd}$ IFSCC Congress, Edinburgh 2002, Oral Papers, Vol. 2, Zastrow et al. and other publications. UVB rays, whose wavelength ranges between 290 and 320 nm, only penetrate up to a depth of approx. 50 μm, whereas UVA radiation reaches the lower dermis layer, i.e. a depth of approx. 3 mm.

The incidence of free radicals, whose lifetime ranges between 0.3 ns (*OH radical) and several seconds (L* radical) and whose production in lower skin layers is mainly due to radiation belonging to the UVA range of the solar spectrum, can be measured by means of spin traps, such as DMPO (5,5'-dimethyl-1-pyrroline-N-oxide) or PBN (phenyl-tert-butylnitrone), and the ESR method.

Commonly available sunscreens have traditional sun protection factors (SPFs) or light protection factors ("Lichtschutzfaktoren"—LSFs) ranging from 2 to 100 and preferably between 4 and 50 on their labels. The information contained therein is based on users' knowledge that they can expose their skin to solar radiation for a longer time, i.e. the time (in minutes) required to develop an erythema (sunburn) multiplied by the respective factor. According to the inventor's own findings, there is no linear correlation between reddening of the skin, which in general has to be regarded as an inflammation (erythema) resulting from a certain dose of UV radiation, and the incidence of free radicals. Moreover, sunscreens contain different amounts of UVA and/or UVB filters and therefore not provide adequate varying and not quantifiable protection against free radicals in most cases. The current SPFs/LSFs which are only related to the effect of UVB appear no longer suitable to properly indicate the protective effect of sunscreens.

The object of the invention is to provide a method for determining an integral sun protection factor which encompasses the entire effect of UVA and UVB radiation on and in the depth of the skin and can serve as an exact guide value for users.

According to the invention a method for determining an integral sun protection factor (∫ SPF) encompassing both UVA and UVB radiation for cosmetic and dermatological sunscreens comprises the steps of (a) applying a defined amount of the sunscreen directly onto a defined area of a skin substrate which has been impregnated before with a known substance acting as a spin trap, (b) exposing the skin substrate to a defined amount of radiation comprising UVA and UVB rays according to natural sun exposure conditions by means of a radiation source, like a sun simulator.

(c) subjecting the skin substrate exposed to radiation to an electron spin resonance (ESR) measurement within 1-120 minutes after exposure, (d) normalizing the free radical generation value RG once it has been compared with a standard sample whose number of free radicals is known, and recording the number of free radicals trapped as a real number X multiplied by $10^{12}$ per 1 mg of sample, RG=X×$10^{12}$ free radicals/mg of skin sample, (e) and determining the integral sun protection factor ∫ SPF according to the equation (1)

$$\int SPF = \frac{E_0}{E} \quad (1)$$

wherein $E_0$ has the meaning of UV dose supplied to the skin sample in mJ/cm² on which the sunscreen product was applied and is calculated in equation (7)

$$E_0 = I*t \quad (7)$$

I=sun simulator irradiance (mW/cm²)
t=exposure time in seconds.

and E has the meaning of effective UV dose in mJ/cm², so related to the detected amount of free radicals generated during step (b)

and wherein E is calculated according to the real number X of free radical generation value in step (d) with equation (2)

$$\log_{10}(E) = a \cdot \log_{10}(X \cdot 1000) + b \quad (2)$$

wherein a and b are experimental parameters which has been determined in a calibration step to achieve a correct linear relationship between logarithm functions to the base ten of UV dose and real number of free radical generation through square error assessment method, and E is calculated according to equation (8)

$$E = 10^{\log 10(E)} \quad (8).$$

A defined amount of a sunscreen according to the aforesaid step (a) is e.g. an amount of 1-4 mg per cm² of skin surface, advantageously 2 mg/cm². The skin samples used and are obtained e.g. from skin biopsies, skin substrates (artificial skin) or pig skin, preferably pieces of skin from pigs' ears which are treated ex vivo. The aforesaid skin samples will hereinafter be referred to as "skin substrate" or "substrate". The sunscreen is applied directly onto the substrate surface.

First, a spin trap, especially PBN, is applied onto the substrate e.g. by incubating the sample to create a stable, long time detectable adduct.

The spin trapping technique was used to study the free radicals/ROS (ROS=Reactive Oxygen Species) generated in skin biopsies upon exposure to light. This technique typically involves the addition of a reactive short-life free radical across the double bond of a diamagnetic "spin trap" to form a much more stable free radical, a "radical adduct". The application of spin traps prolongs the life time ($10^{-9}$ s-$10^{-3}$ s) of even the most reactive free radicals/ROS, like hydroxyl radicals (.OH), superoxide anion radicals ($O_2^-$.) and lipid radicals (L.), by the formation of spin trap adducts (minutes-hours) which can be measured by ESR techniques. A preferred spin trap is PBN (Phenyl-tert-butylnitrone) which can provide a very stable ESR signal during a long time (about 60 min) and so is particularly well adapted to quantify the free radicals generated in skin after different UV doses. This reagent was purchased from Sigma Munich Germany. The reaction with PBN takes place as follows:

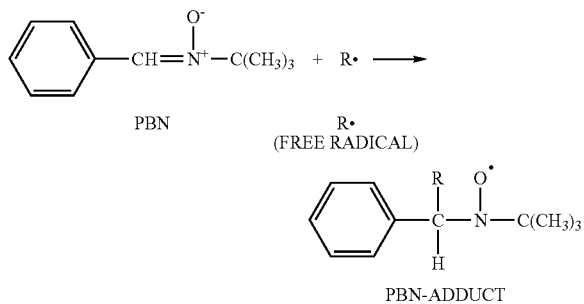

The substrate is impregnated for e.g. 30 minutes with the spin trap solution before UV irradiation. The spin trap PBN is solved in e.g. a water/ethanol (50/50) solution resulting in a 400 mM concentration.

Subsequently, the substrate surface is washed e.g. with water/ethanol and dried, and the predetermined amount of sunscreen, e.g. 2 mg/cm$^2$, is spread on directly to the substrate after a short rest period.

The substrate is left to rest for 5-60 minutes, preferably 10-15 minutes, and advantageously a piece of skin punched out of the substrate is exposed to radiation from a sun simulator according to step (b) at 17.53 mW/cm$^2$ for the UVA range and 0.37 mW/cm$^2$ for the UVB range. The aforesaid parameters roughly correspond to natural sun exposure conditions. The measurement was carried out after 1-120 minutes by means of ESR spectroscopy.

An important advantage of ESR spectroscopy over optical methods like Fluorescence or Chemiluminescence is the penetration depth of the used electromagnetic waves in biological tissues. The ESR wavelength is about $10^5$ times longer than the other techniques, which results in a penetration depth of about 10 mm in human tissue. An undisturbed investigation of the whole skin up to the lower dermis is possible. This measuring range is very interesting to detect the effect of UV radiations even in the deepest layers of the whole skin. This property predestinates ESR spectroscopy for the assessment of Protection Factors. However, direct calculation from ESR signal intensity can lead to an underestimation of the Protection Factor if no spin trap is present.

The time between exposure to radiation and measurement depends on the limited lifetime of the adduct formed by the spin trap and the free radical. Advantageously, it is 1-90 minutes.

The advantage of spin trap PBN is the high stability of the adduct, allowing quantitative analysis, and the high signal response resulting from the non selectivity between different types of trapped radicals like hydroxyl or carbon centered radicals. The signal shape is the same for all trapped free radicals, achieving a higher peak intensity.

The quantification of the generated free radicals was performed by the peak to peak signal amplitude of the PBN adduct (low field peak). The signal amplitude was normalized on the amplitude of a calibration sample (standard) with a known number of free radicals. This standardisation is the basis for the calculation of the RG value (Radical Generation value=RGV). The RGV describes the number of trapped free radicals and is presented as a real number X multiplied by $10^{12}$ normalized to 1 mg of the investigated sample (skin), means to a volume element of 1 mm·1 mm·1 mm with the assumption of a density 1 for human skin and a thickness about 1 mm.

Different concentrations of sunscreens for valuation and calibration of the method of the invention are simulated by arranging standard radiation-reducing filters between the radiation source emitting a defined amount of radiation and the skin substrate.

Preferred radiation-reducing filters used are neutral density filters having reduction factors of 1, 2, 5, 10 and 20 (Lot Oriel, France). The neutral density filters are composed of fused silica substrates in which a vacuum deposit of a thin layer of a metal was realised. The coating thickness determines the optical density. The absorbency is almost independent of the wavelength in the UV band (290-400 nm) and independent of the mode of application proper of cosmetic standards.

All known sunscreens (UV filters) can be measured with the present method, e.g. 4-aminobenzoic acid derivatives, esters of cinnamatic acid, benzylidene camphor derivatives, benzophenone derivatives, methoxybenzoyl methane derivatives etc. These sunscreens comprising e.g. Benzophenone-3, Benzophenone-4, Octyl Methoxycinnamate, Homosalate, Phenylbenzimidazole Sulfonic Acid, Ethylhexyl Methoxycinnamate, Isoamyl p-Methoxycinnamate, Ethylhexyl Triazone, Diethylhexyl Butamido Triazone, 4-Methylbenzylidene Camphor, PABA, Ethylhexyl Dimethyl PABA etc. Also physical filters such as $TiO_2$, $ZnO$, $ZrO_2$ etc. can be measured. For example the following UV filters with its abbreviations were be measured according to the method of the present invention.

ES=Ethylhexylsalicylate; OC=Octocrylene; IMC=Isoamyl p-Methoxycinnamate; BMDBM=Butyl Methoxydibenzoylmethane; MBBT=Methylene bis-Benzotriazoyl tetramethylbutylphenol (supplied as a 50% aqueous dispersion). The latter is supplied under "Tinosorb M" trade name. BEMT=Bis-Ethylhexyloxyphenol Methoxyphenyl Triazine. The latter is supplied under "Tinosorb S" trade name.

UV absorption spectra of different sunscreens were realised with a Labsphere UV 1000 S Transmittance analyser, through a spectroscopic method described in Cosmetics and Toiletries, Vol. 118, n° 10, October 2003). Sunscreen samples were spread on a transparent roughened PMMA plate at 1.2 mg cm$^{-2}$. The in vivo SPF(s) were determined according to the COLIPA sun protection factor test method (SPF Test Method. Colipa Ref: 94/289 (1994). The in vivo UVA protection factors were determined using the persistant pigment darkening (PPD) as the end point (*Photodermatol. Photoimmunol. Photomed.* 16, 245-249 (2000).

The method according to the invention is the very first to take into account that the origin of any skin damage related to the action of total UV is the total number of free radicals produced. This number depends on the overall UV dose rather than the UV rays' intensity. The total number of free radicals produced can be precisely measured by means of ESR, and an integrated SPF can be determined which provides the user with exact information on the actual degree of protection from UV.

Such an SPF is integrated in two senses: it encompasses the entire UV spectrum as well as the complete depth up to which the skin can be damaged by UV radiation.

Another advantage consists in that the iSPF (ISPF or ∫ SPF) can be measured with the same or even increased reliability using 2 to 4 pieces of skin flaps measuring 1 cm$^2$ each and obtained from human skin surgery or skin substrates (artificial skin), or directly on pig skin, instead of measuring the appearance of an erythema of a test person's skin after ethical questionable exposure to radiation. In this way, there will be no radiation-induced damage to test persons' skin since the new measuring method does not require test persons at all. According to COLIPA standard 10-20 volunteers are needed. In addition, the consequences of long waiting times before receiving the results are avoided, and there is no need to define certain standards which are required as a reference for evaluation in the known methods.

The new method considerably reduces costs both from an equipment and a methodological point of view since, already at present, an RGV measurement involves only half to one third of the costs incurred by the traditional methods for determining SPFs.

In addition, the iSPF (ISPF or ∫ SPF) can be measured and calculated with an accuracy of approx. ±10%, while the accuracy of traditional SPF measuring method i.e. COLIPA (UVB protection) is only ±20-25%, or even 30-50% for high SPFs measured in different test-institutes.

Already today, the PPD method is rather complicated and inaccurate when used for dark skin types, i.e. improvements in this respect will expand the range of methods available and lead to more reliable results. The method of the present invention is skin type independent and independent from ethnic skin coloration.

Another advantage of the method according to the invention consists in that less complex equipment is needed. Large-surface lamp systems for exposing large skin surfaces to UV radiation can be replaced with smaller, more powerful, point-shaped radiation units.

The measurement of generated free radicals during UV irradiation of the skin biopsies was performed with Electron Spin Resonance (ESR) using an aligned ESR X-band spectrometer. The spectrometer was an ERS 300+ (ZWG Germany and modified by Galenus Germany) with the following spectrometer settings: microwave frequency $f_0$=9.52 GHz, microwave power Pµ=20 mW, modulation frequency fm=100 kHz, modulation amplitude Bm=0.2 mT, magnetic field scan ΔBs=20 mT, scan time ts=60 s.

Possibly usable are also the following spectrometer settings: microwave power Pµ 10-100 mW, modulation amplitude Bm 0.05-0.5 mT, magnetic field scan ΔBs 5-20 mT, scan time ts 10-120 s.

The cosmetic or pharmaceutical preparation to be measured can also incorporate all anti-oxidant molecules or free radical scavenger molecules known in the state of the art. Such substances include vitamins such as vitamin C and derivatives thereof, for example, ascorbyl acetate, ascorbyl phosphate, and ascorbyl palmitate; vitamin A and derivatives thereof; folic acid and derivatives thereof; vitamin E and derivatives thereof, such as tocopheryl acetate; superoxiddismutase; flavones or flavonoids; amino acids, such as histidine, glycine, tyrosine, tryptophan, and derivatives thereof; carotenoids and carotenes such as, for example, α-carotene, β-carotene; uric acid and derivatives thereof; α-hydroxy acids such as citric acid, lactic acid, malic acid; stilbene and derivatives thereof etc.

A further preferred anti-oxidant for the preparation to be measured is an active substance with a high radical protection factor comprising a product obtained by extraction of the bark of Quebracho blanco and subsequent enzymatic hydrolysis, containing at least 90 percent by weight of proanthocyanidine oligomers and up to 10 percent by weight of gallic acid, linked to microcapsules, further an extract of the silkworm obtained by extraction, containing the peptide Cecropine, amino acids and a vitamin mix, further a non-ionic, cationic or anionic hydrogel or mixture of hydrogels, further one or several phospholipids and water. Also contained in the complex preparation can be an ultrasound decomposition product of a yeast containing at least 150 units of superoxide dismutase per ml, and one or more cyclodextrins. The complex preparation can be a product according to WO99/66881 example 1 or 2, or WO 01/26617 example 1. Also an active complex of plant extracts in alcoholic solution as anti-oxidant is preferred The complex comprises 0.1-2% by weight of green coffee beans extract, 0.1-2% by weight leaves extract of *Camellia sinensis*, 0.1-2% by weight *Pongamia pinnata* extract and 0.1-2% by weight root extract of *Angelica archangelica* as well as a monovalent $C_2$-$C_5$ alcohol to make up 100%.

The invention will be more detailed in the following examples. In the accompanying drawings will be FIG. 1: Schematic representation of Protection Factor assessment FIG. 2: RG data (X×$10^{12}$ from Table I) versus UV dose FIG. 3: Linear Relationship between log (UV dose) and log (Free Radical generation), according to data of FIG. 2

Figure 4:
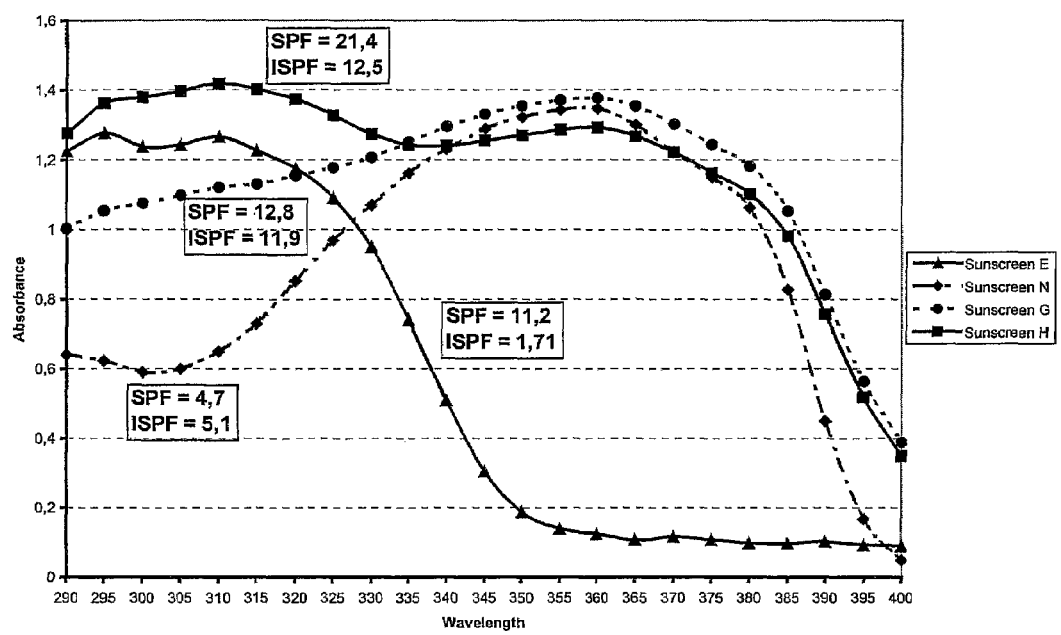

FIG. 4: UV spectrum of sunscreens E, N, G and H.

EXPERIMENTAL RESULTS

Relationship Between UV Dose and Free Radical Generation (RG)

Supply of different irradiance intensities to the skin biopsies was realised by using unfiltered UV source (Attenuation Factor of 1) and UV source filtered by neutral density filters with Attenuation Factors of 2, 5, 10 and 20. They are placed between the UV source and the skin biopsy, just at the opening of the sample holder. Neutral density filters attenuate all wavelengths rays by a same factor. Five different times of irradiation were used: 30, 60, 150, 300 and 600 seconds. With the non attenuated UV source, this corresponds to about 1.7, 3.5, 8.7, 17.4 and 34.8 minutes of natural sun exposure. This also corresponds to 0.11, 0.21, 0.54, 1.07 and 2.14 MED.

First it has been checked if Reciprocity law is well respected. This means to demonstrate that the level of generated free radicals only depends on the dose and not on application time. This is another pre-requisite to calculate realistic Protection Factors.

Irradiation times were chosen to achieve a dose progression linked to the neutral density filter attenuations. For example, Attenuation 2 assay can be achieved with 2 times more exposure duration (t=60 seconds) than Attenuation 1 assay (t=30 seconds). Thus a same UV dose could be supplied using different times of irradiation.

This is shown in Table 1 where the measured amount of UV induced free radicals (RG=X×$10^{12}$ radicals/mg) is reported, according to the different exposure times and the various optical attenuations. UV doses (mJ/cm$^2$) were calculated (not reported in Table 1) through equation (6):

$$UV\ dose = \frac{I \cdot t}{Att} \quad (6)$$

I=sun simulator irradiance (mW/cm$^2$); t=exposure time (s);

Att=neutral density filter attenuation

A constant UV dose (537 mJ/cm$^2$) could be achieved along the diagonal (from top left to bottom right) of Table 1, according to the 5 irradiation times: 30, 60, 150, 300 and 600 seconds, and the 5 attenuation factors: 1, 2, 5, 10 and 20. An equal amount of free radicals should be measured if reciprocity law is valid.

That can be observed, with a quasi constant radical generation along this whole time range: RG average=$1.36 \cdot 10^{12}$ radicals/mg of skin biopsy with a low relative standard deviation: only 7.03% for these 5 values.

Other constant RG values corresponding to different repeated UV doses can also be found in some little diagonals of Table 1. They are identified by specific shades/dots.

Thus, Table 1 confirms that reciprocity law is well validated in a large range of UV doses.

TABLE 1

RG values measured on skin biopsies ($X \cdot 10^{12}$ rad/mg) according to the different filter attenuations and the different irradiation times.

| IRRADIATION TIME (s) | NEUTRAL UV FILTER ATTENUATION | | | | |
|---|---|---|---|---|---|
| | 1 | 2 | 5 | 10 | 20 |
| 30 | 1.34 | 0.65 | 0.53 | 0.30 | 0.31 |
| 60 | 1.82 | 1.39 | 0.79 | 0.54 | 0.44 |
| 150 | 2.83 | 1.99 | 1.26 | 0.96 | 0.67 |
| 300 | 3.48 | 2.96 | 1.92 | 1.40 | 1.07 |
| 600 | 4.07 | 3.70 | 2.46 | 2.07 | 1.50 |

Secondly, the relationship between UV dose and Radical generation (RG) has been studied.

With 4 neutral density filters and the unfiltered UV source, multiplied by the 5 different irradiation times, 25 different UV exposures could be supplied, corresponding to 13 distinct UV doses (see Table 1).

Figure 2:
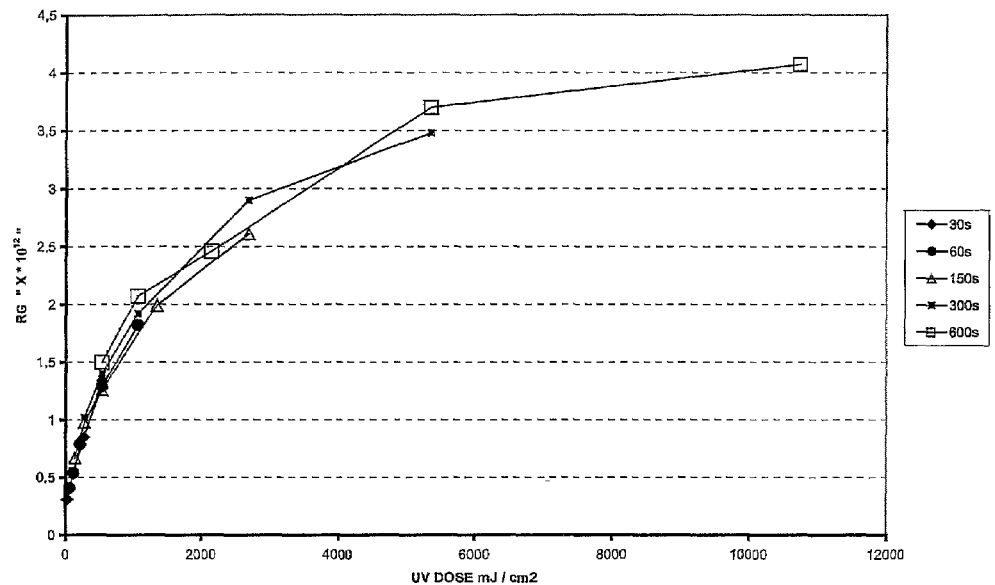

Free radical generation in skin according to the UV dose is plotted in graph of FIG. 2. In spite of the different exposure times, we can note that all the individual experimental data plots are well grouped and disposed around a single curve. Plots can be connected according to a non linear relationship, whichever exposure time is considered. This is obviously the consequence of reciprocity law validity. Free radical generation versus UV dose shows a saturation for the high UV doses.

However, a simple linear function could be superposed to the experimental plots when a double log scale was adopted, allowing to calibrate very easily the method. Such a representation is shown in graph of FIG. 3, in which log UV dose versus log RG was plotted. In the present study, real number X of RG data was multiplied by a factor 1000, in order to avoid negative data trough logarithm function transformation.

The following linear function achieves a good correlation with the experimental data, according to a simple numerical adjustment of parameters a and b through the least-square error method:

$$\log(\text{UV Dose}) = a \cdot \log(1000 \cdot X) + b \quad (2b)$$

This relationship (inverse to first relationship of FIG. 3) allows to calculate a UV dose related to a detected amount of free radical (RG) in a skin biopsy on which a sunscreen product has been spread.

Determination of Protection Factors

The above experimental results allowed to develop a method for the determination of Protection Factors. They are calculated as ratio of UV doses, as generally used. Method is schematically described in FIG. 1 with:

$E_0$ is UV dose supplied to the system protective layer/skin biopsy.

E is UV dose obtained through calibrated equation 2, from the number X of free radicals measured by ESR spectroscopy. This "effective" UV dose should be provided to a non-protected biopsies to give the same amount of free radicals measured on the protected biopsies, on which a 2 mg/cm$^2$ sunscreen layer was spread.

Figure 3:
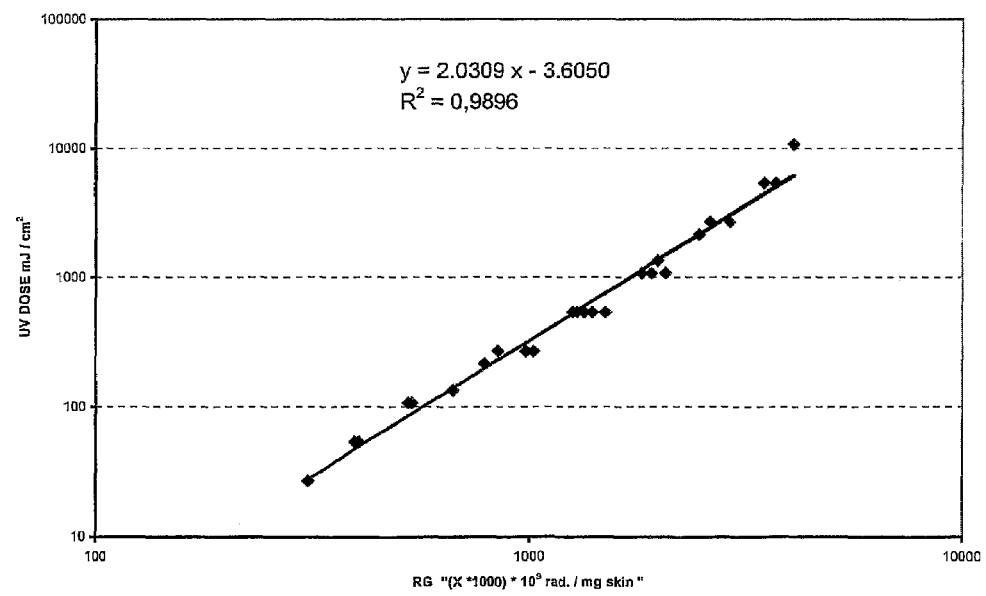

Table 2 contains Protection Factors based on this method with data received from Table 1 and with parameter values of equation 2 reported in FIG. 3. They are compared to the neutral density filter attenuation values which served as references. Each calculated Protection Factor is the average of 5 values corresponding to the different irradiation times. Attenuation of neutral filters and calculated Protection Factors are very close.

TABLE 2

Calculation of Protection Factors of neutral density filters, from the RG data reported in Table 1.

| | Neutral Filter attenuation | | | | |
|---|---|---|---|---|---|
| | 1 | 2 | 5 | 10 | 20 |
| Calculated Protection Factor | 1.33 | 2.23 | 5.54 | 9.86 | 18.40 |
| Standard Deviation | 0.42 | 0.2 | 0.61 | 1.78 | 2.38 |

The Integrated SPF:

The above documented relationship between UV dose and RG value allows to calculate protection factors in a similar way as in vivo SPF. Validity of these new protection factors has been checked by using neutral density filters as standard protective layers.

Therefore using the same methodology as in the in vivo SPF determination, with:

$$\text{Definition: } SPF = \frac{MED_p}{MED_u} \text{ for erythema end point}$$

Where $MED_p$=Minimal erythemal UV dose supplied to protected skin $MED_u$=Minimal erythemal UV dose supplied to unprotected skin (Blank).

According to the schematic description (FIG. 1), $MED_p$ and $MED_u$ correspond now to $E_0$ and E when erythema end point is replaced by the amount of free radical RG detected by ESR spectroscopy.

The quantitative measurement of free radicals by means of ESR X-band spectroscopy, allows to determine a new sun protection factor. Whereas, greater penetration depth of ESR spectroscopy allows a complete investigation of the skin, covering the whole range of UVB and UVA as well as the skin vertical from the surface till the subcutis. With this, we propose to name this new protection indice Integrated Sun Protection Factor (iSPF, ISPF or ∫SPF).

The Determination of the ∫SPF:

The principal way has been shown in FIG. 1. The following steps are done:

1) Numerical relationship between UV dose and free radical generation (RG) has been established (assessment of a and b parameters of equation 2). Both equation parameters should be adjusted (calibrated) from time to time by measuring free radical generation in non protected biopsies submitted to different UV doses.

2) The protected biopsies (2 mg/cm² of a sunscreen product spread on epidermis surface) are irradiated. Free radical generation is assessed by ESR spectroscopy for each time exposure (t). Therefore, the RG value of the protected biopsy=$X_t$ (measured).

3) The corresponding UV dose supplied to the protected biopsy $(E_0)_t$ is calculated for each exposure time with:

$$(E_0)_t = \text{Irradiance} \cdot \text{time}. \quad (3)$$

4) Effective UV dose $(E)_t$ required to generate the same amount $X_t$ of free radicals is calculated, according to a and b parameters of equation 2:

$$\log(E)_t = a \cdot \log(1000 \cdot X_t) + b \quad (2a)$$

5) The integrated SPF of the sunscreen product is calculated as ratio of UV doses for a same exposure time:

$$\int SPF = \frac{(E_0)_t}{(E)_t} \quad (1a)$$

Examples 1 and 2

Two different sunscreen samples were tested, both achieving a high protection in UVB and different UVA protection levels: Sunscreen A is a physical $TiO_2$ sunscreen, with a SPF of 26 and a UVA PF (PPD)=5; Sunscreen B is an organic UV filter sunscreen, with a SPF=39 and a UVA PF (PPD)=12.

Both products were applied on the skin surface at 2 mg/cm² and were tested according to 3 irradiation times. Non covered skin biopsies were also tested in parallel, a set directly exposed to sun simulator and a second set exposed through neutral density filter with attenuation 30. Each free radical generation data, reported in Table 3, was averaged on 4 biopsies.

TABLE 3

Free radical generation according to different irradiation times (RG = X · 10¹² rad/mg).

| Time exposure (seconds) | X Blank No Attenuation | X Neutral filter Att. 30 | X Sunscreen A | X Sunscreen B |
|---|---|---|---|---|
| 60 s | 1.82 | 0.34 | 0.62 | 0.48 |
| 120 s | 2.36 | 0.49 | 0.84 | 0.66 |
| 180 s | 2.82 | 0.54 | 0.98 | 0.75 |

In a first step, relationship between free radical generation ($X_t$·1000) and UV dose was again established, in order to test its reproducibility. Non covered skin biopsies were used, without and with the neutral density filter. UV dose received by these skin biopsies was calculated according to equation (6).

If calibration data are plotted in a graph of double logarithmic XY axis one receives precise equation (2) parameters according to the following equation (5):

$$\text{Log(UV Dose)} = 2.0947 \cdot \text{Log}(1000 \cdot X) - 3.7463 \quad (5)$$

One can note that equation (5) is very close to the linear relationship presented in FIG. 3.

All data of table 3 were transformed through function logarithm (base 10) in order to obtain a linear relationship:

TABLE 3a

| Column 2 | | Column 3 | |
|---|---|---|---|
| Log (1000*Radical generation) Blank | Log (UV Dose) Blank | Log (1000*Radical generation) Attenuation 30 | Log (1000*Radical generation) Attenuation 30 |
| 3,26007139 | 3,03100428 | 2,53147892 | 1,55388303 |
| 3,372912 | 3,33203428 | 2,69019608 | 1,85491302 |
| 3,45024911 | 3,50812554 | 2,73239376 | 2,03100428 |

Then Log (Radical) vs Log (UV Dose) is correlated via equation 2:

TABLE 3b a and b parameter adjustment

| LOG 1000*RGF | LOG UV DOSE | LOG UV DOSE CALC (equat. 1) | SQUARE of LOG UV DOSE DIFFERENCE = Delta² |
|---|---|---|---|
| 3,26007 | 3,03100 | LogE1 = a*3,26007 − b | = ((3,03100 − LogE1)/ 3,03100)² |
| 3,37291 | 3,33203 | LogE2 = a*3,37291 − b | = ((3,33203 − LogE2)/ 3,33203)² |
| 3,45025 | 3,50812 | | |
| 2,53148 | 1,55388 | | |
| 2,69019 | 1,85491 | | |
| 2,73239 | 2,03100 | | |
| TOTAL Square Difference | | | = Summation Delta² |

Then a and b values were determined to minimise the Total Square difference Delta². Thus equation 2 is well adjusted to experimental values with a=2.0947 and b=3.7463. After adjusted equation 2 is used to find Log E according to different X values.

The UV doses can be calculated from radical generation data of Table 3. They are reported in Table 4. The calculation method was first checked by comparing calculated UV doses to supplied UV doses for Blank and neutral filter 30. Only small differences were observed, with a maximum deviation of 13%. Secondly, effective UV doses were calculated for sunscreen products A and B. These UV doses should be provided to non-protected biopsies to give the same amount of free radicals measured on protected biopsies, on which a 2 mg/cm² sunscreen layer was spread.

TABLE 4

Calculated UV doses (mJ/cm²) from equation (5), according to radical generation data of Table 3

| Time (seconds) | Supplied UV Dose | Calculated Dose Blank | Calculated Dose Attenuation 30 | Calculated Dose Sunscreen A | Calculated Dose Sunscreen B |
|---|---|---|---|---|---|
| 60 s | 1074 | 1209.16 | 36.00 | 126.72 | 74.13 |
| 120 s | 2148 | 2083.77 | 77.41 | 239.39 | 144.45 |
| 180 s | 3222 | 3025.83 | 94.88 | 330.63 | 188.81 |

According to UV doses of Table 4, Protection Factors (∫ SPF) are calculated as ratio of UV doses, supplied on calculated (effective) for a same exposure time (equation 1).

Results are reported in Table 5. Indices accuracy is checked with Blank and neutral filter 30 assay. Sunscreen new protection factors are reported in columns 4 and 5 of the same Table.

Incertitude (±95% confidence interval) was also calculated according to all the measurements (4 biopsies for each exposure time).

∫ SPF (Integrated SPF) are calculated, as ratio of supplied UV dose to effective UV dose for a same exposure time (equation 1). Each reported ∫ SPF is the average of 3 calculations corresponding to the different irradiation times. Incertitude (±95% confidence interval) was also calculated and reported in the Table 6.

TABLE 6

RG data according to different irradiation times (RG = X × $10^{12}$ rad/mg).
A mean ∫ SPF is calculated from the three different exposure times.

| Time exposure | Blank | Sunscreen C No UV filter | Sunscreen D UVB 1 SPF 7.6 | Sunscreen E UVB 2 SPF 11.2 | Sunscreen F UVA/UVB 1 SPF 4 PPD 5.2 | Sunscreen G UVA/UVB 2 SPF 12.8 PPD 8.2 | Sunscreen H UVB 1 + UVA/UVB 21.4 PPD 8.6 |
|---|---|---|---|---|---|---|---|
| 30 s | 1.29 | 1.26 | 1.19 | 1.06 | 0.52 | 0.41 | 0.4 |
| 60 s | 1.79 | 1.73 | 1.48 | 1.34 | 0.77 | 0.57 | 0.54 |
| 150 s | 2.73 | 2.70 | 2.36 | 2.28 | 1.19 | 0.79 | 0.79 |
| ∫ SPF ± 95% CI | 1 | 1.13 ± 0.03 | 1.44 ± 0.11 | 1.71 ± 0.11 | 6.22 ± 0.68 | 11.90 ± 1.46 | 12.51 ± 1.29 |

TABLE 5

Calculated sun protection indices ∫ SPF, based on ratio of UV doses reported in Table 4.

| | ∫ SPF | | | |
|---|---|---|---|---|
| Time (seconds) | No. Attenuation Blank | Neutral filter Attenuation 30 | Sunscreen A SPF 26/ PPD 5 | Sunscreen B SPF 39/ PPD 12 |
| 60 s | 0.89 | 29.83 | 8.48 | 14.49 |
| 120 s | 1.03 | 27.75 | 8.97 | 14.87 |
| 180 s | 1.06 | 33.96 | 9.75 | 17.07 |
| Average ± 95% CI | 0.99 ± 0.10 | 30.51 ± 7.23 | 9.06 ± 1.13 | 15.47 ± 2.82 |

As a first observation, one can note that Integrated SPF is increased with UV filtration broadness. The highest value is found for sunscreen B which has the best in vivo UVA (PPD). In both tested samples, Integrated SPF is clearly lower than the in vivo erythemal SPF.

Examples 3-8

In order to determine Integrated SPF selectivity for different UV filtration broadness, special sunscreen formulations were realised, with different UVB and/or broadband UVA/B filters.
Example 3=sunscreen C=O-W Base without UV filter
Example 4=sunscreen D=Base+UV filter 1 (5% IMC)
Example 5=sunscreen E=Base+UV filter 2 (10% IMC)
Example 6=sunscreen F=Base+Broadband UVA/UVB filter 1 (1.5% BMDBM+3% MBBT)
Example 7=sunscreen G=Base+Broadband UVA/UVB filter 2 (3% BMDBM+8% MBBT+2% BEMT)
Example 8=sunscreen H=Base+UV filter 1 (5% IMC)+Broadband UVA/UVB filter 2 (3% BMDBM+8% MBBT+2% BEMT)

The six sunscreen samples were tested as described with 3 different irradiation times: 30, 60 and 150 s.

Each radical generation data X, reported in Table 6, is the average of 4 biopsy measurements.

These examples confirm that ∫ SPF is clearly increased according to broadness and intensity of UV filtration. Non well balanced UVB/UVA sunscreens failed to achieve protection enhancement. This was dramatically observed with poor UVA filtering sunscreens, like D and E, in which a single UVB filter was incorporated. For these products, the real biological relevant protection against UV radiation, given by ∫ SPF, is dramatically lower related to the assumption expressed in the erythemal SPF.

Example 9

Compared to in vivo PPD and in vivo SPF, ∫ SPF takes into account the total sun UV spectrum: UVB+UVA.

These measuring effects of ESR (in the depth of the skin) can lead on the other hand to a misinterpretation of the values for the quantification of free radicals created by UVB. As it could be shown, this value is about $0.24 \times 10^{12}$ radicals/mg. All these ROS are however contained in a volume element of 1 mm×1 mm×0.05 mm with the assumption of 50 micrometers for the average epidermis. Therefore, the number of free radicals created in the epidermis is 3 fold higher than in the deeper layers of the skin under the influence of UVA, with round about $1.58 \times 10^{12}$ free radicals/mg.

These number of roughly $4.8 \times 10^{12}$ radicals in the epidermal volume element created by UVB alone could be very relevant for the creation of biological effects like erythema or related DNA damages. First in dictations show that UVB induced DNA damages can be prevented with very high doses of antioxidants. Lin & al reported protection against thymine dimer formation by a combination of vitamins C and E measured on pig skin.

To complete the experiments, a sunscreen with good UVA protection only was added to the sample panel. 5.0% BMDBM was incorporated in a cosmetic base, achieving a strong absorption in UVA and a low absorption in UVB (Sunscreen N, FIG. 4). As expected, a low in vivo erythemal SPF=4.7 (±1.3) was measured. Question arise on Integrated SPF: would it not turn too much toward a non realistic high value, according to a possible lack of sensitivity of our skin model for UVB radiation? Applying the new method to product N, we got an Integrated SPF comparable to the in vivo SPF: ∫ SPF=5.1 (±1.2). Thus, no overestimation of UV protection can happen, even when a low UVB protection and a high UVA protection is realised on a same product, as shown in FIG. 4.

Inversely, any correlation could be shown up with the in vivo SPF.

Depending on UV filter formulation, In Vivo SPF data is largely over (if a strong UVB protection is present in the sunscreen) or equivalent to the integrated SPF. Of course, the erythemal SPF does not take into account importance of UV filtration broadness, and so can induce consumers with a wrong safety feeling, mainly for high SPF values. From this point of view, the new ∫ SPF supplies a worth information.

Graph of FIG. 4 summarizes 4 typicals examples, showing main differences between erythemal SPF and Integrated SPF. Sunscreen E with UVB protection and no UVA protection, sunscreen N with UVA protection but few UVB protection, sunscreen G with about the same UVB and UVA protection and sunscreen H with UVB protection higher than UVA protection.

Spectra and protection indices show that erythemal SPF is very sensitive to UVB filtration and very few sensitive to UVA filtration. Oppositely, the ∫ SPF of the invention is found sensitive to both UVB and UVA filtrations.

According to the method of the invention it is clear that only products with a broad UVB/UVA filtration can achieve a high Integrated SPF. This is in accordance with the fact that UVA and UVB radiations are involved to generate free radicals in the totality of the skin biopsy (epidermis+dermis). Moreover, this new protection factors issued from ESR spectroscopy includes well the appearance of the UVB derived erythema and, as could be shown, is well correlated with the in vivo UVA PPD.

Integrated SPF can be interpreted like traditional in vivo UV indices:

A ∫ SPF=10 protection means that one could stay 10 times longer in the sun than with unprotected skin, without getting a sunburn and being significantly below the time necessary to reach a PPD response. According to, 1 hour constant sun exposure with a ∫ SPF=10 product gives to the skin a minored free radical damage, which corresponds to only 6 min of direct unprotected sun exposure.

The invention claimed is:

1. A method for determining an integral sun protection factor (∫ SPF) encompassing both UVA and UVB radiation for cosmetic and dermatological sunscreens, which method comprises the steps of
 (a) applying a defined amount of a sunscreen directly onto a defined area of a skin substrate which has been impregnated before with a known substance acting as a spin trap,
 (b) exposing the skin substrate to a defined amount of radiation comprising UVA and UVB rays according to natural sun exposure conditions by means of a radiation source,
 (c) subjecting the skin substrate exposed to radiation to an electron spin resonance (ESR) measurement within 1-120 minutes after exposure,
 (d) normalizing a free radical generation value RG once it has been compared with a standard sample whose number of free radicals is known, and recording a number of free radicals trapped as a real number X multiplied by $10^{12}$ per 1 mg of sample, RG=X×$10^{12}$ free radicals/mg of skin sample,
 (e) and determining the integral sun protection factor ∫ SPF according to the equation (1)

$$\int SPF = \frac{E_0}{E}, \qquad (1)$$

wherein $E_0$ has a meaning of UV dose supplied to the skin sample in mJ/cm$^2$ on which the sunscreen was applied and is calculated in equation (7)

$$E_0 = I \cdot t \qquad (7)$$

I=sun simulator irradiance (mW/cm$^2$)
 t=exposure time in seconds,
 and E has the meaning of effective UV dose in mJ/cm$^2$, so related to the detected amount of free radicals generated during step (b)
 and wherein $\log_{10}$ E is calculated according to the real number X of free radical generation value in step (d) with equation (2)

$$\log_{10}(E) = a \cdot \log_{10}(X \cdot 1000) + b \qquad (2)$$

in which the number of free radicals is not proportional to the UV dose and
 wherein a and b are experimental parameters which have been determined in an adjustment step to achieve a correct linear relationship between logarithm functions to the base ten of UV dose and real number of free radical generation through square error assessment method, and E is calculated according to equation (8)

$$E = 10^{\log_{10}(E)} \qquad (8).$$

2. The method according to claim 1, wherein the defined amount of sunscreen directly applied to the substrate surface ranges between 1 and 4 mg per 1 cm$^2$ of skin surface at a given concentration of the sunscreen.

3. The method according to claim 2, wherein other concentrations of the sunscreen are simulated and the method calibrated by arranging standard radiation-reducing filters between the radiation source emitting a defined amount of radiation and the skin substrate.

4. The method according to claim 3, wherein the standard radiation-reducing filters used are neutral density filters having reduction factors of 1, 2, 5, 10 and 20.

5. The method according to claim 4, wherein exposure to radiation continues for 30, 60, 150, 300 and 600 seconds, and more if sunscreen photostability should be assessed.

6. The method according to claim 1, wherein the ESR measurement is carried out 1-120 minutes and preferably 15-60 minutes after exposure to radiation.

7. The method according to claim 1, wherein parameters of the spectrometer used for the ESR measurement are:
 microwave frequency $f_0$=9.52 GHz, microwave power Pμ=20 mW, modulation frequency fm=100 kHz, modulation amplitude Bm=0.2 mT, magnetic field scan ΔBs=20 mT, and scan time ts=60 s.

8. The method according to claim 1, wherein the spin trap used is a substance selected from phenyl-tert-butylnitrone or dimethyl-1-pyrroline-N-oxide.

9. The method according to claim 1, wherein the sunscreen is part of a cosmetic or pharmaceutical preparation and the preparation comprises one or more of known physical and organic filters selected from the group consisting of Benzophenone-3, Benzophenone-4, Octyl Methoxycinnamate, Homosalate, Phenylbenzimidazole Sulfonic Acid, Ethylhexyl Methoxycinnamate, Isoamyl p-Methoxycinnamate, Ethylhexyl Triazone, Diethylhexyl Butamido Triazone, 4-Methylbenzylidene Camphor, PABA, Ethylhexyl Dimethyl PABA, ethylhexylsalicylate, octocrylene, isoamyl-p- methoxycinnamate, butyl methoxydibenzoylmethane, methylene bis-benzotriazolyl tetramethylbutylphenol, bis-ethylhexyloxyphenol methoxyphenyl triazine and mixtures thereof.

10. The method according to claim 9, wherein the cosmetic or pharmaceutical preparation to be measured incorporates known anti-oxidant molecules or free radical scavenger molecules.

11. The method according to claim 1, wherein the skin substrate is selected from the group consisting of skin biopsies, artificial skin and pieces of pig skin, preferably skin from pigs' ears.

12. The method according to claim 1, wherein the radiation source is a sun simulator.

* * * * *